United States Patent [19]
Bielick et al.

[11] Patent Number: 5,651,493
[45] Date of Patent: Jul. 29, 1997

[54] METHOD OF PERFORMING SOLDER JOINT ANALYSIS OF SEMI-CONDUCTOR COMPONENTS

[75] Inventors: James D. Bielick, Oronoco; Mark K. Hoffmeyer; Phillip D. Isaacs, both of Rochester, all of Minn.

[73] Assignee: International Business Machines Corporation, Armonk, N.Y.

[21] Appl. No.: 427,509

[22] Filed: Apr. 24, 1995

[51] Int. Cl.$^6$ .............................. B23K 1/19; B23K 31/02; B23K 31/12
[52] U.S. Cl. ............................................ 228/105; 228/103
[58] Field of Search ................................. 228/105, 103

[56] References Cited

U.S. PATENT DOCUMENTS

| | | |
|---|---|---|
| 3,087,238 | 4/1963 | Nottingham . |
| 4,230,754 | 10/1980 | Maher et al. .............................. 428/76 |
| 4,352,714 | 10/1982 | Patterson et al. ........................ 156/626 |
| 4,621,193 | 11/1986 | Van Hoye ................................. 250/302 |
| 4,777,901 | 10/1988 | Marsden et al. . |

FOREIGN PATENT DOCUMENTS

| | | |
|---|---|---|
| 59-204746 | 5/1983 | Japan . |
| 2-297048 | 5/1989 | Japan . |

OTHER PUBLICATIONS

Andrew J. Mawer, et al., "Plastic BGA Solder Joint Reliability Considerations", Surface Mount International Conference, Aug. 28, 1994, pp. 239–251.

*Metals Handbook*, 9th Ed., vol. 6, ASM, Metals Park, OH, Aug. 1983, pp. 847–848.

*Primary Examiner*—P. Austin Bradley
*Assistant Examiner*—Jeffrey T. Knapp
*Attorney, Agent, or Firm*—Felsman, Bradley, Gunter & Dillon, LLP

[57] ABSTRACT

A method for analyzing solder joint assemblies in devices such as solder bumped silicon chips, ball grid arrays or land grid arrays is disclosed. The method includes applying a dye solution to a device under test and then causing that dye solution to penetrate any interstices between any solder interconnect and the device under test, which also includes penetrating any fractures in any joints or joint failures. Next, the dye is dried or cured so as to provide ready analysis upon the analysis portion of the method. The device under test is then caused to be separated or fractured in such a way that a seam or border of a solder joint or an attachment border may be analyzed to identify any structural failure by visually analyzing where any dye has penetrated such structural failures.

15 Claims, 9 Drawing Sheets

METHOD OF PERFORMING SOLDER JOINT ANALYSIS OF SEMI-CONDUCTOR COMPONENTS

BACKGROUND OF THE INVENTION

1. Technical Field

The present invention relates, generally, to electrical component interconnection analysis, and more particularly, to a method of providing global or comprehensive analysis into the mechanical and electrical integrity of all interfaces in an electronic component interconnection scheme. More particularly still, the present invention relates to a method of conducting failure analysis using dye penetration in assessing the solder joint assemblies on components, packages, and circuit boards in board packaging assemblies and other high density packaging approaches.

2. Description of the Related Art

Most integrated circuit components that are attached to a circuit board or the like, typically are attached using mechanical means, such as soldering. When the devices were small, having few leads going from the component to the board, a visual inspection could be made to determine whether the bonding had been adequate and whether a good mechanical connection had been obtained with proper solder flow. Currently, the use of Land Grid Array (LGA) wiring/pad designs for silicon chip interconnection, along with Ball Grid Array (BGA) and Column Grid Array (CGA) type modules are used for silicon chip attachment or first level package attachment to a second level board electronic packaging assembly. These schemes are used because of the high density packaging necessity. These packaging designs offer increased wire density over peripheral component attachment schemes that incorporate the use of wire bonded ICs or solder J-lead and gull wing leaded modules.

Unfortunately, the solder joints that are made on LGA-type packaging designs cannot be visually inspected beneath chip or component bodies after carrier attachment. Accordingly, strict assembly process controls must be placed on variables that affect successful and reliable solder joint formation on both component and carrier.

At present, available techniques that provide for inspection of LGA interconnections are quite costly and do not provide the required visual clarity in all cases or are time consuming and yield information on a limited number of solder joints. For example, X-ray laminography is expensive and time consuming and does not provide a visual account of the scanned unit. Additionally, metallographic cross sectioning, or the slicing of a unit, to view the solder joint in a side view only shows the exposed joint, without showing whether any other portion that is unexposed.

Accordingly, what is needed is an inspection method that provides for a comprehensive analysis of all LGA-type interconnections and all associated LGA interconnection interfaces that provides a useful understanding of critical variables involved in assembly process development, process qualification, and a production ramp, and which can prompt the occurrence of otherwise unnecessary rework or potential for latent field defects in shipped products.

SUMMARY OF THE INVENTION

It is therefore one object of the present invention to provide an electrical component interconnection analysis.

It is another object of the present invention to provide a method of providing global or comprehensive analysis into the mechanical and electrical integrity of all interfaces in a electronic component interconnection scheme.

It is yet another object of the present invention to provide a method of conducting failure analysis using dye penetration in assessing the solder joint assemblies on components, packages, and circuit boards in board packaging assemblies and other high density packaging approaches.

The foregoing objects are achieved as is now described.

According to the present invention, a method for analyzing solder joint assemblies in devices such as ball grid arrays or land grid arrays is disclosed. The method includes applying a dye solution to a device under test (DUT) and then causing that dye solution to penetrate any interstices between any solder interconnect and the device under test, which also includes penetrating any fractures in any solder joints or joint failures. Next, the dye is dried or cured so as to provide ready analysis upon the analysis portion of the method. The device under test is then caused to be separated or fractured in such a way that a seam or border of a solder joint or an attachment border may be analyzed to identify any structural failure by visually analyzing where any dye has penetrated such structural failures.

In an attempt to provide additional capillary action, the device under test (DUT) may be placed under a vacuum or exposed to heat to insure evaporation of any solution varying the dye or full cure or, after which the DUT is allowed to cool to room temperature before separation. Once the visual analysis is done, a parametric analysis may be performed on the observed data.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
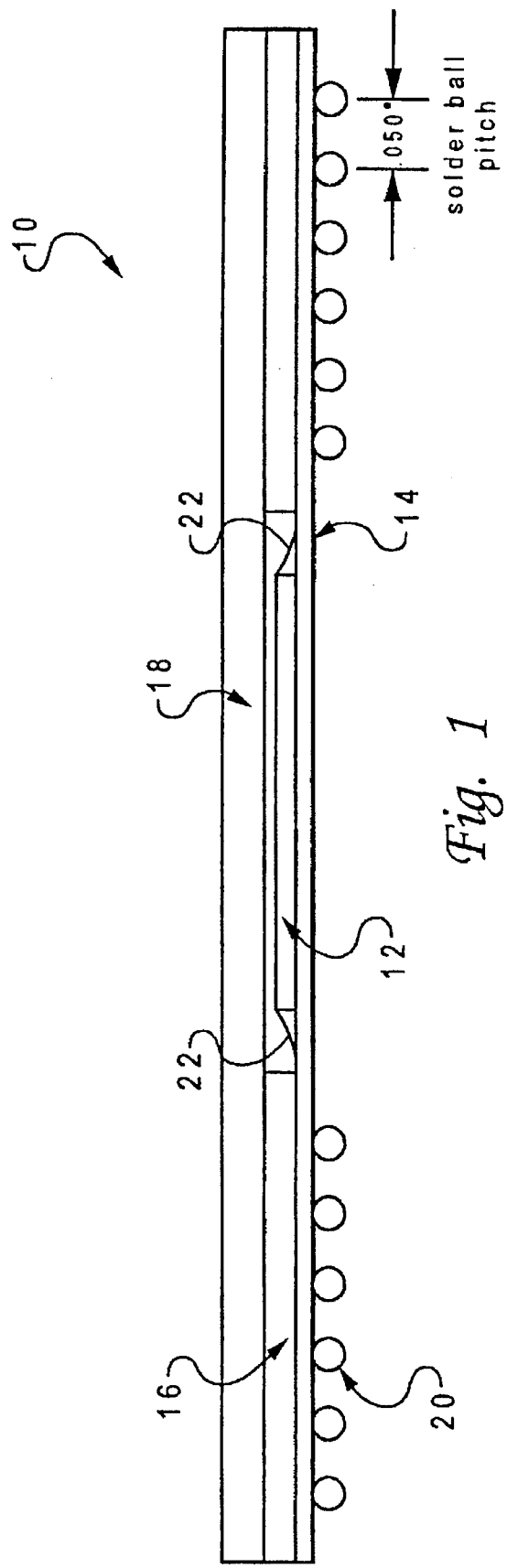
FIG. 1 depicts in accordance with a preferred embodiment of the present invention a tape ball grid array (TBGA) package.

A typical tape ball grid array (TBGA) package 10 is illustrated in a cutaway side view in FIG. 1. Package 10 is a 28 millimeter package having anywhere from 200 to 600 or more input/output (I/O) pins. Such a package typically is used in, for example, an AS/400 processor or memory card, which is a mid-level computer manufactured by International Business Machines. Computer package 10 includes a chip 12, which is mounted to a tape substrate 14. A copper stiffener 16 is mounted on either side of chip 12 to tape substrate 14. A cap or heat sink 18 is placed over the entire assembly to protect the chip and to help dissipate excess heat. Solder balls 20 are typically spaced at a 0.050" pitch for subsequent soldering. Wire leads 22 extend from chip 12 to the I/O pins (not shown), which are connected to the card (not shown) via solder balls 20.

During a structure failure analysis test, the heat sink and the solder connection of the solder balls are evaluated for attachment to the substrate. Secondary stress impacts on the solder joints are also assessed from the attachment of the massive heat sinks atop the BGA-type package. The evaluation allows for identification of most, if not all, LGA interconnection defects related to BGA solder processing.

Examples of defects that can be identified with the use of this method include solder opens, solder insufficiency, secondary solder cracking from partial reflow during subsequent assembly or local rework adjacent to BGA packages, solder dewets, contamination, voids, pad delamination from excessive heat application during BGA rework, and liquid solder joint separation due to card warpage during rework. In addition, the analysis method is also used on assemblies after Accelerated Thermal Cycling (ATC) reliability tests or power cycling to assess robustness of LGA interconnection against fatigue related failures on card interfaces, module interfaces, intermetallic compound interfaces, and intergranular solder cracking intrinsic to solder balls, solder columns, and C4 solder bumps.

Figure 2A:
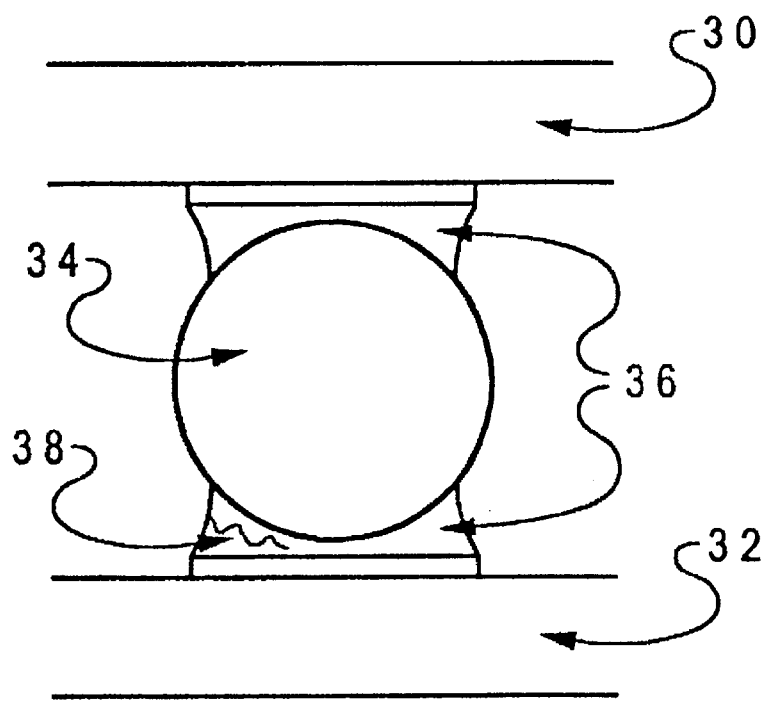
FIG. 2 is a cross sectional view of a cracked solder joint fillet identified according to the present invention.
Figure 2B:
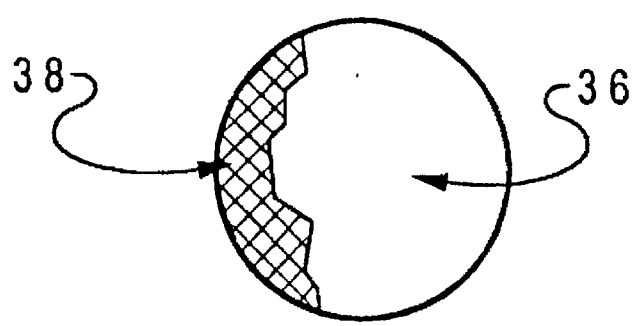

An example of the method used to identify a cracked solder joint fillet is illustrated in FIG. 2. FIG. 2 is an example of a dye penetrant identification of a cracked Ceramic Ball Grid Array (CBGA) solder joint fillet, taken in a cutaway side view. A ceramic module 30 is attached to a circuit board 32 via solder ball 34. Two solder fillets 36 are used to attach the assembly together. A fatigue crack 38 is illustrated in the solder fillet 36 to circuit board 32. The bottom portion of FIG. 2 is a fresh fractured solder surface induced from mechanical removal where an exposed fatigue crack in solder fillet 36 is covered with the dye used to define the fatigue crack in the solid solder fillet prior to mechanical removal.

Figure 3:
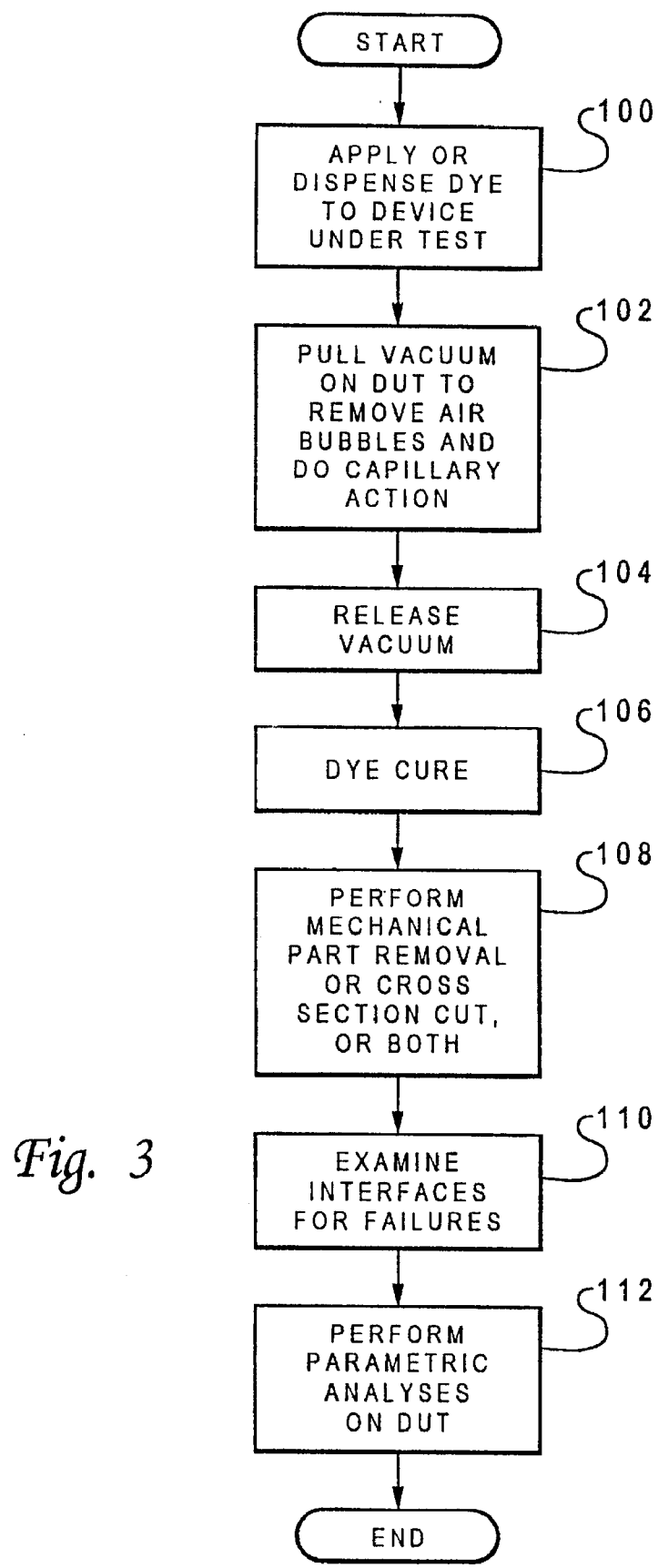
FIG. 3 depicts the method for performing or allowing a comprehensive visual analysis of all grid array interconnection interfaces.

The method for performing or allowing a comprehensive visual analysis of all LGA interconnection interfaces is depicted in the flow chart of FIG. 3. The method involves the application of a colored dye solution that is carefully syringe dispensed or "painted" along all exposed edges of the BGA component to carrier interconnections comprising the assembly. Thus, in step 100, the dye is applied or dispensed to the part to be tested. The dye then wicks into the interstices between the LGA solder interconnections via capillary action. After the dispensing operation is completed, the component/carrier hardware is placed in a vacuum, in step 102, where application of a vacuum occurs, which may last from five to twenty minutes or a time sufficient enough to make sure complete coverage of all exposed surfaces occurs, which includes cracks or imperfections. In step 104, the vacuum is released to atmospheric pressure, aiding in complete coverage by the dye in all fractured regions sufficient to remove air bubbles from front regions, and then the hardware assembly is exposed to elevated temperatures, ranging from 50° to 100° C., for about 24 hours, or at least until the dye has dried or cured depending on the dye. In step 106, the hardware is removed from the oven and allowed to cool to room temperature. Once the hardware has cooled, the devices are mechanically removed from the carriers via a suitable means (step 108). The various removal methods may include a carrier torque, Instron tensile removal, or hand removal via mechanical leverage along a device edge or edges. Alternatively, a cross sectional edge may be prepared by either sawing or cutting the structure, to allow analysis of the solder.

The mechanical removal process provides that the weakest interface comprising each LGA interconnection will fail and can be overlapped via optical microscopy for evidence of dye penetration. Evidence of dye penetration to, or within, any interface comprising a portion of the LGA interconnection indicates the existence of a process or hardware related defect present prior to the mechanical removal of the device.

After the surface interfaces are examined (step 110), a parametric analysis is then performed (step 112) using presence of dyes as the response variable. This may be done by generating a compilation of fatigue related failures obtained from dye penetrant tests on the assemblies. This leads to the generation of failure analysis maps of module/chip sites. These maps provide important information with respect to manufacturing and reliability defects, since defect patterns generated from mapping also reveal evidence suggesting assembly related defects or true reliability related phenomena, such as fatigue or creep. Moreover, mapping results also provide useful insight into analytical failure rate predictions and mechanical modeling of LGA-type interconnection structures as well.

Figure 4A:
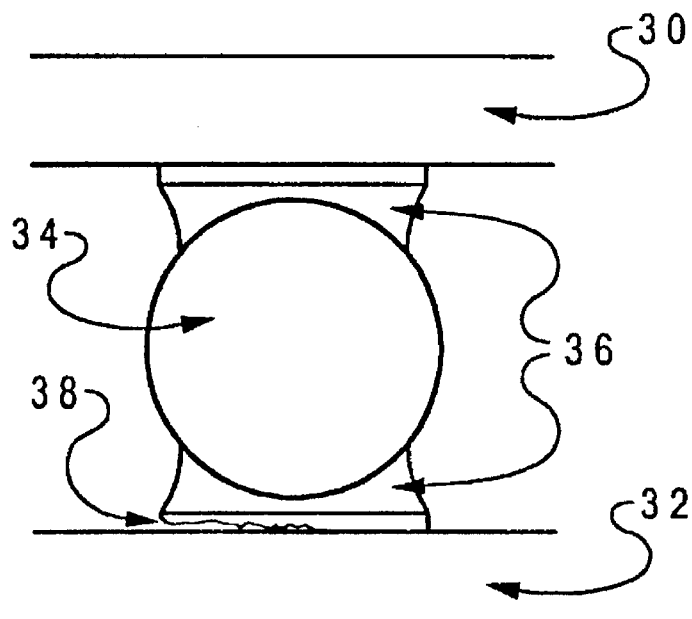
FIG. 4 is a solder pad/circuit board delamination where the shaded portion shows dye on the card interface and the light portion shows no dye on the interface.
Figure 4B:
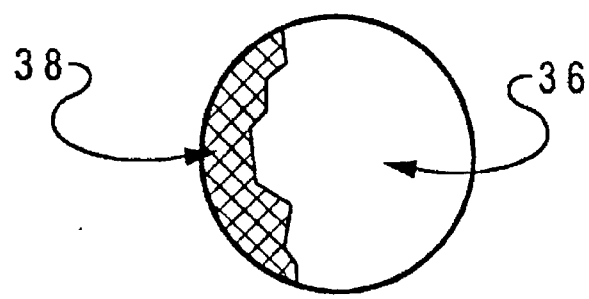
Figure 5A:
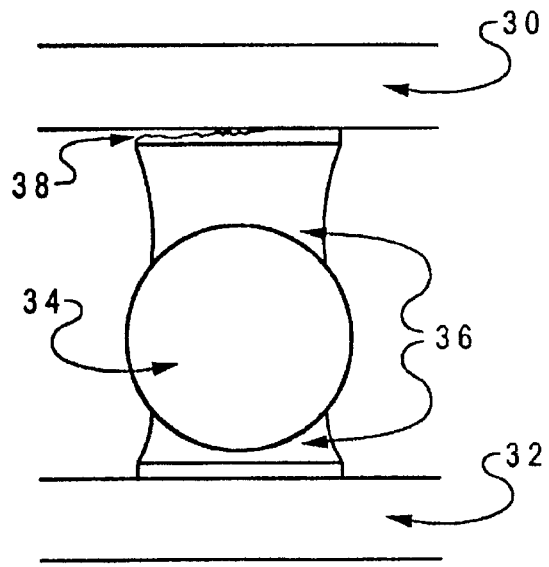
FIG. 5 depicts the metallization delamination on a module where the shaded portion again represents dye on the module interface and no dye is represented by the light portion on the interface.
Figure 5B:
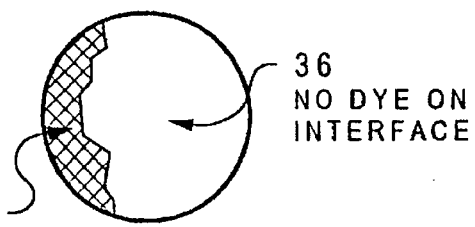
Figure 6A:
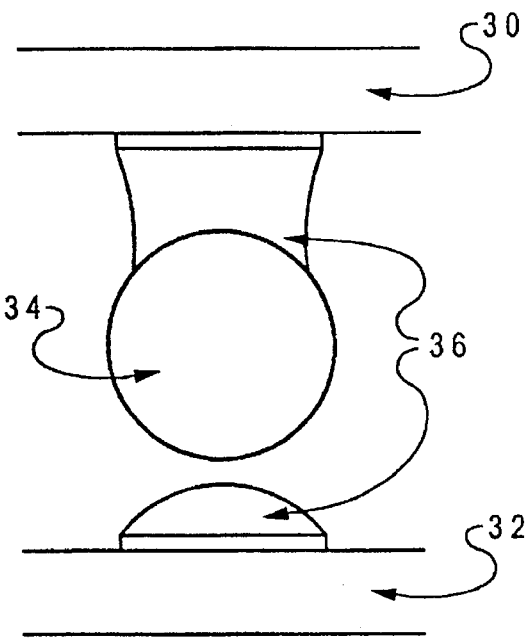
FIG. 6 is a dewet of solder where the dye covers the entire solder on the card.
Figure 6B:
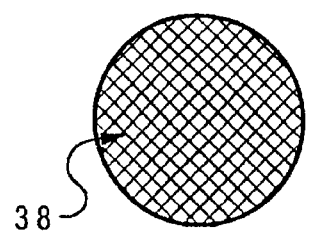
Figure 7A:
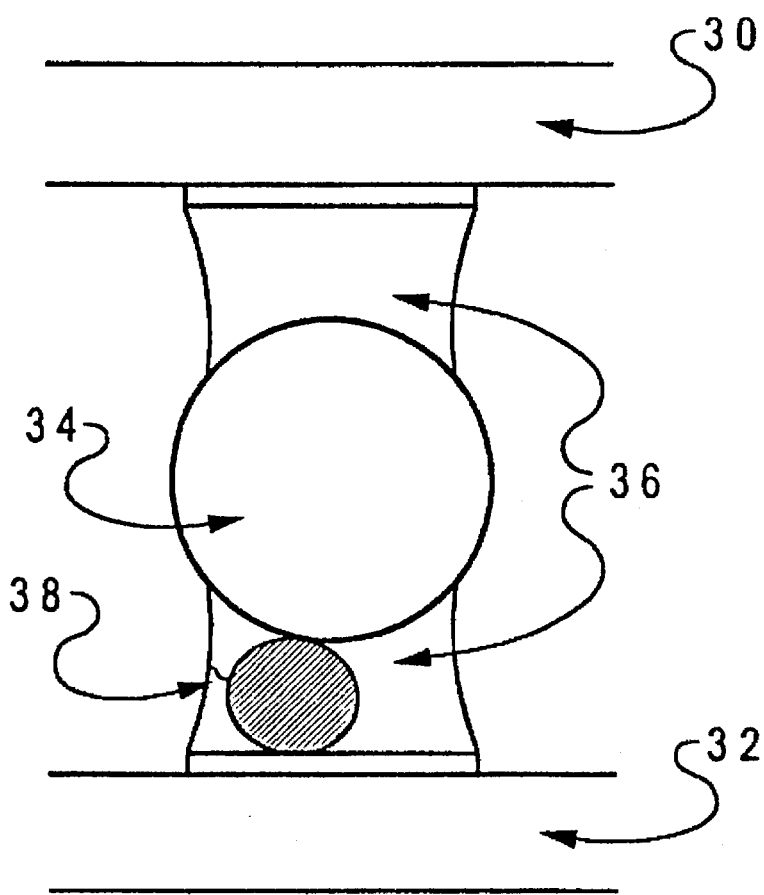
FIG. 7 depicts a crack leading into a void in a solder joint.
Figure 7B:
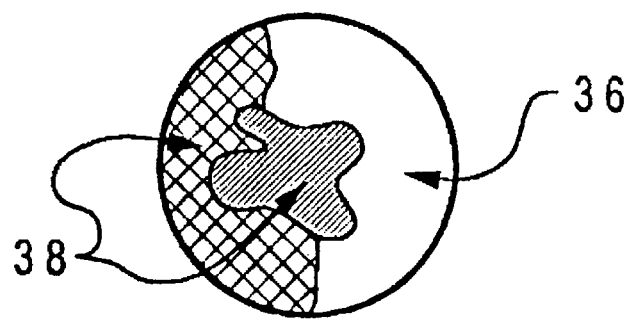

Other failure examples are depicted in FIGS. 4–13. FIG. 4 is an example of a solder pad/circuit board delamination where the shaded portion shows dye on the card interface and the light portion shows no dye on the interface. FIG. 5 shows an example of the metalization delamination on a module where the shaded portion again represents dye on the module interface and no dye is represented by the light portion on the interface. FIG. 6 illustrates an example of a dewet or no wetting of solder where the dye covers the entire solder on the card, as shown by the shaded portion. FIG. 7 represents a crack leading into a void in a solder joint where the shaded portion is the dye on the cracked solder region and in the solder void and the light portion is the fractured solder without any dye penetration.

Figure 8:
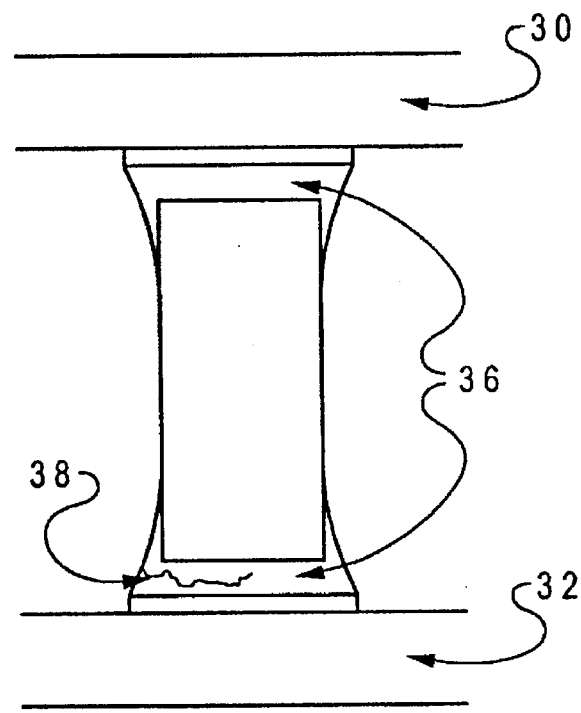
FIG. 8 is a solder column where a crack in the solder joint has occurred.
Figure 9:
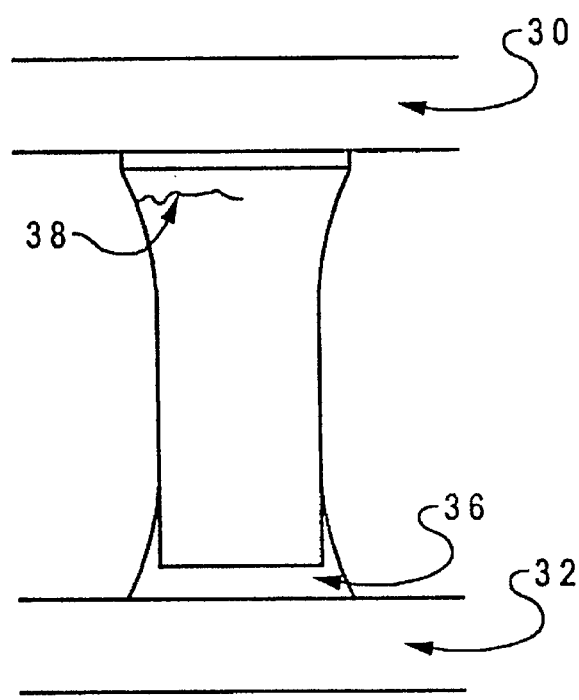
FIG. 9 depicts a solder column where there is a crack in a cast solder column.

FIG. 8 represents an example involving a solder column where a crack in the solder joint has occurred. FIG. 9 represents a solder column where there is a crack in a cast solder column.

Figure 10:
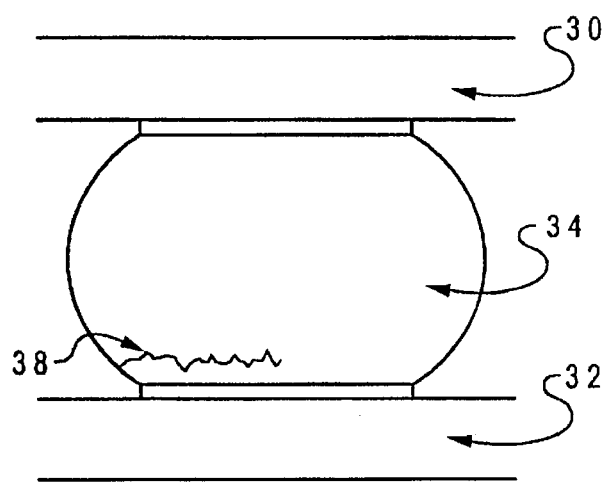
FIG. 10 is a eutectic solder ball that has a crack in the solder.
Figure 11:
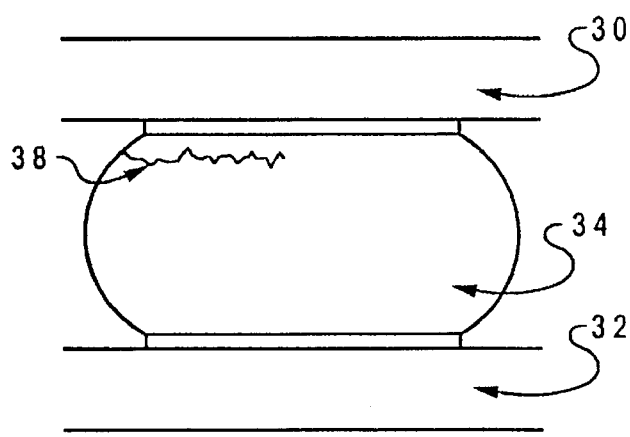
FIG. 11 depicts a C4 attachment of a silicon chip to a silicon chip carrier using a high lead solder bump where a crack exists in the solder bump.
Figure 12:
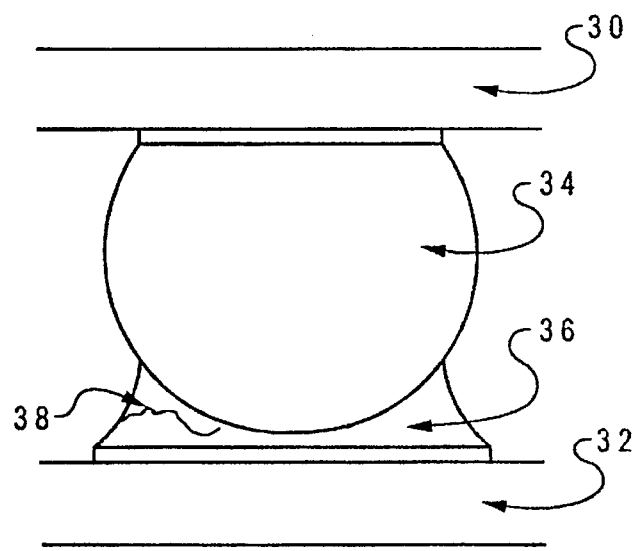
FIG. 12 is a low temperature eutectic solder flip chip attachment.

FIG. 10 shows a eutectic solder ball that has a crack in the solder. FIG. 11 represents a C4 attachment of a silicon chip to a silicon chip carrier using a high lead solder bump where a crack exists in the solder bump. FIG. 12 represents a low temperature eutectic solder flip chip attachment example. Here a silicon chip attaches to a silicon chip carrier using a high lead bump solder where a crack has occurred in the fillet.

Figure 13A:
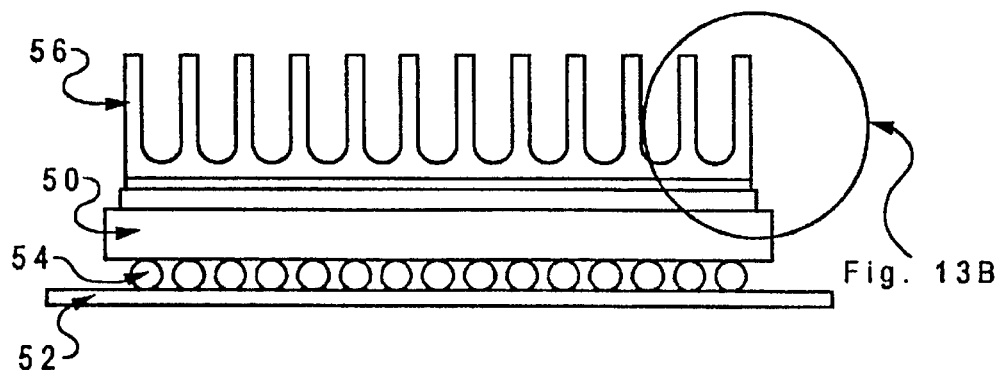
FIG. 13 (13A–13C) illustrates a heat sink adhesion analysis on modules.
Figure 13B:
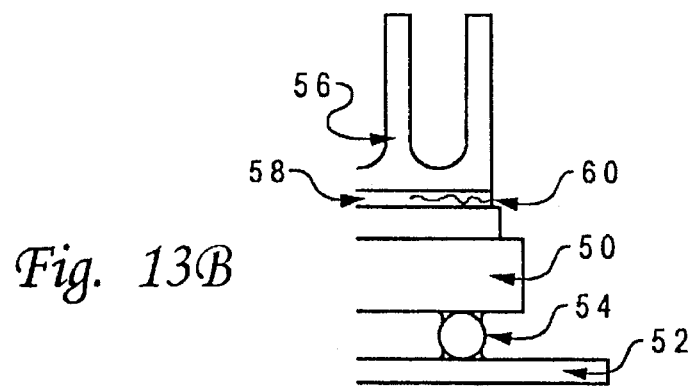
Figure 13C:
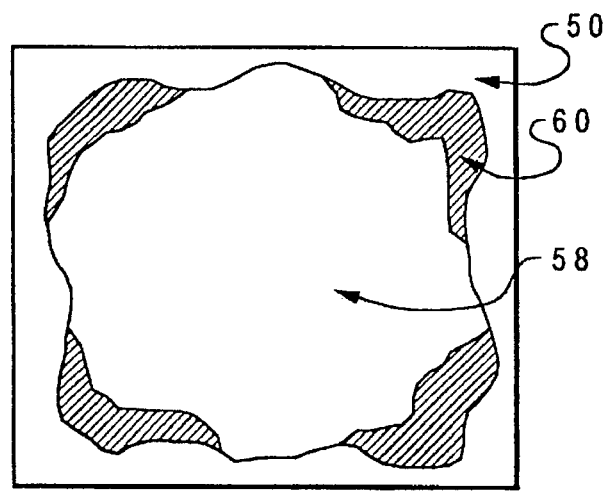

Lastly, FIG. 13 (13A–13C) illustrates a heat sink adhesion analysis on modules. A BGA module 50 is provided which attaches to a carrier card 52 using solder ball joints 54. A heat sink 56 is further attached to TBGA module 50 using a heat sink adhesive layer 58. An exploded partial view is shown in FIG. 13B where a crack 60 has occurred in the adhesive layer. FIG. 13C shows the affects of the crack in adhesive layer 58 with shaded portions, which represent the dye injected and placed on the module.

While the invention has been particularly shown and described with reference to a preferred embodiment, it will be understood by those skilled in the art that various changes in form and detail may be made therein without departing from the spirit and scope of the invention.

We claim:

1. A method for analyzing solder joint assemblies between components in a device under test using a grid array interconnection arrangement comprising the steps of:

applying a dye solution to said device under test (DUT);

causing said dye solution to penetrate any interstices between any solder interconnect and said DUT;

drying and curing said dye solution; and separating a first component from a second component of said DUT along said solder interconnections.

2. The method according to claim 1 wherein said drying step further comprises the step of:

exposing said DUT to an elevated temperature to ensure complete evaporation of all solution bearing said dye solution or full cure, thus leaving a dye colorant within said dye solution; and allowing said DUT to cool to room temperature.

3. The method according to claim 1 wherein said device under test is a ball grid array package.

4. The method according to claim 1 wherein said device under test is a land grid array package.

5. The method according to claim 1 wherein said DUT further comprises a heat sink mounted to a surface of said DUT.

6. The method according to claim 1 further comprising the step of:

visually analyzing the borders of said components at said separation point by examining whether any dye had penetrated, thus indicating structural failure.

7. The method according to claim 6 wherein said step of analyzing said borders further includes the step of performing a parametric analysis or said DUT to determine any structural failure.

8. A method for analyzing solder joint assemblies between components in a device under test using a grid array interconnection arrangement comprising the steps of:

applying a dye solution to said device under test (DUT);

causing said dye solution to penetrate any interstices between any solder interconnect and said DUT by placing said DUT in a vacuum;

drying said dye solution; and separating a first component from a second component of said DUT along said solder interconnections.

9. The method according to claim 8 wherein said drying step further comprises the step of:

exposing said DUT to an elevated temperature to ensure complete evaporation of all solution bearing said dye solution or full cure, thus leaving a dye colorant within said dye solution; and allowing said DUT to cool to room temperature.

10. The method according to claim 8 wherein step of drying said dye solution further includes the step of curing said dye solution.

11. The method according to claim 8 wherein said device under test is a ball grid array package.

12. The method according to claim 8 wherein said device under test is a land grid array package.

13. The method according to claim 8 wherein said DUT further comprises a heat sink mounted to a surface of said DUT.

14. The method according to claim 8 further comprising the step of:

visually analyzing borders of said solder joint assemblies of said first and second components at separation points by examining whether any dye had penetrated, thus indicating structural failure.

15. The method according to claim 14 wherein said step of analyzing said borders further includes the step of performing a parametric analysis of said DUT to determine any structural failure.

* * * * *